(12) United States Patent
Lee et al.

(10) Patent No.: US 10,036,591 B2
(45) Date of Patent: Jul. 31, 2018

(54) TEMPERATURE CONTROLLING EQUIPMENT

(71) Applicant: MPI Corporation, Hsinchu County (TW)

(72) Inventors: Yueh-Ying Lee, Hsinchu County (TW); Helge Jacob Krystad, Hsinchu County (TW); Ying-Chiao Chang, Hsinchu County (TW)

(73) Assignee: MPI Corporation, Hsinchu County (TW)

( * ) Notice: Subject to any disclaimer, the term of this patent is extended or adjusted under 35 U.S.C. 154(b) by 301 days.

(21) Appl. No.: 14/826,195

(22) Filed: Aug. 13, 2015

(65) Prior Publication Data

US 2016/0258679 A1  Sep. 8, 2016

(30) Foreign Application Priority Data

Mar. 4, 2015  (TW) .............................. 104106852 A

(51) Int. Cl.
 *F26B 5/04* (2006.01)
 *F26B 3/04* (2006.01)
 *G01R 31/00* (2006.01)
 *G01R 31/28* (2006.01)

(52) U.S. Cl.
 CPC .............. *F26B 3/04* (2013.01); *G01R 31/003* (2013.01); *G01R 31/2862* (2013.01); *G01R 31/2874* (2013.01)

(58) Field of Classification Search
 CPC ......... H01L 21/67109; H01L 21/60798; H01L 21/00; F23B 3/04; F23B 3/14; F26B 11/042; G01R 31/2874; G01R 31/003; G01R 31/00; G01R 31/317; G01R 31/26; G01R 31/28; G01R 31/2877; G01R 31/2601; G01R 31/2862; F25B 45/00; F16L 59/06; F16L 59/14
 USPC ........... 324/750.01–750.14; 34/89, 235, 242, 34/417, 286, 299
 See application file for complete search history.

(56) References Cited

U.S. PATENT DOCUMENTS

| | | | | |
|---|---|---|---|---|
| 4,172,993 | A | * | 10/1979 | Leach ................. G01R 31/2817 324/750.08 |
| 4,939,621 | A | * | 7/1990 | Galian .................... F27B 17/02 165/61 |
| 2003/0137317 | A1 | * | 7/2003 | Kim ...................... G01R 1/0483 324/750.03 |

\* cited by examiner

*Primary Examiner* — Kenneth Rinehart
*Assistant Examiner* — John McCormack
(74) *Attorney, Agent, or Firm* — CKC & Partners Co., Ltd.

(57) ABSTRACT

A temperature controlling equipment includes a connection head of a fluid output device, an isolation hood, a drying chamber and a dry air source. The connection head of the fluid output device has an output nozzle and a first fluid output pipe. The isolation hood has a hood body and a second fluid output pipe. The hood body defines a working space. The output nozzle is communicated with the working space. The second fluid output pipe is communicated with the working space and the first fluid output pipe. The first fluid output pipe and the second fluid output pipe have a connection interface in between. The connection interface is at least partially located in the drying chamber. The dry air source is communicated with the drying chamber and is configured to provide a dry air to the drying chamber.

13 Claims, 4 Drawing Sheets

TEMPERATURE CONTROLLING EQUIPMENT

RELATED APPLICATIONS

This application claims priority to Taiwanese Application Serial Number 104106852, filed Mar. 4, 2015, which is herein incorporated by reference.

BACKGROUND

Technical Field

The present disclosure relates to temperature controlling equipment.

Description of Related Art

When a testing environment of a stable temperature is to be established in testing equipment, especially in a low-temperature environment below zero degree Celsius, one of the approaches is that a low-temperature fluid is continuously supplied to the testing equipment. In order to continuously supply the low-temperature fluid into the testing equipment, the testing equipment should require a fluid discharge pipe, so as to discharge the used low-temperature fluid away from the testing environment. Thus, the temperature in the testing equipment can be maintained, and the pressure in the testing equipment will not increase to cause problems due to poor sealing.

Traditionally, after the low-temperature fluid flows into the testing chamber of the testing equipment, the low-temperature fluid flows to the fluid discharge pipe. However, the connection interface of the fluid discharge pipe can easily become the leaking breach for the low-temperature fluid. Although accessories such as sealing rings are generally utilized to the connection interface of the fluid discharge pipe, the leaked low-temperature fluid can easily harden the accessories such as the sealing rings such that the sealing rings can no longer achieve a good sealing effect. Consequently, phenomenon of frosting or dew condensation can be found at the connection interface of the fluid discharge pipe or on the accessories such as the sealing rings.

Therefore, the method to prevent the phenomenon of frosting and dew condensation at the connection interface of the fluid discharge pipe or on the accessories such as the sealing rings is undoubtedly an important development direction in the field of low-temperature testing.

SUMMARY

A technical aspect of the present disclosure provides a temperature controlling equipment, which can first dilute the temperature fluid leaked at the connection interface between the connection head of the fluid output device and the isolation hood by the dry air, followed by discharging, avoiding the phenomenon of frosting or dew condensation at the connection interface.

According to an embodiment of the present disclosure, a temperature controlling equipment includes a connection head of a fluid output device, an isolation hood, a drying chamber and a dry air source. The connection head of the fluid output device has an output nozzle and a first fluid output pipe. The isolation hood has a hood body and a second fluid output pipe. The hood body defines a working space. The output nozzle is communicated with the working space. The second fluid output pipe is communicated with the working space and the first fluid output pipe. The first fluid output pipe and the second fluid output pipe have a connection interface in between. The connection interface is at least partially located in the drying chamber. The dry air source is communicated with the drying chamber and is configured to provide a dry air to the drying chamber.

According to an embodiment of the present disclosure, an isolation hood is configured to connect with a connection head of a fluid output device in a temperature controlling equipment. The connection head of the fluid output device has an output nozzle and a first fluid output pipe. The isolation hood includes a hood body, a second fluid output pipe and a drying chamber. The hood body defines a working space configured to be communicated with the output nozzle. The second fluid output pipe is configured to communicate with the working space and the first fluid output pipe. The second fluid output pipe has a recessed portion near an exit. The drying chamber is connected with a dry air source. The drying chamber is disposed on the working space, and the recessed portion is at least partially located in the drying chamber.

When compared with the prior art, the above-mentioned embodiments of the present disclosure have at least the following advantages:

(1) Since the connection interface is at least partially located in the drying chamber, even if a little leakage of the temperature fluid occurs at the connection interface, the temperature fluid leaked will be first diluted by the dry air without moisture in the drying chamber, and then discharged outside the isolation hood. Thus, the phenomenon of frosting or dew condensation at the connection interface is avoided.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
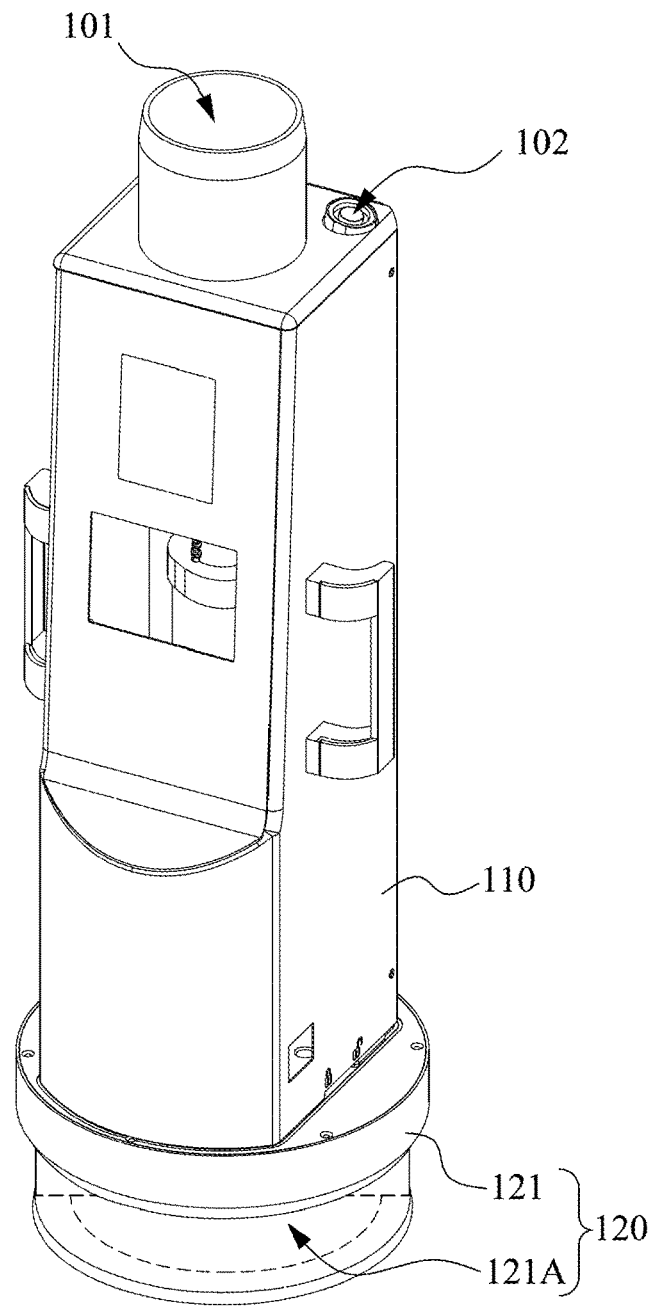
FIG. 1 is a schematic view of a temperature controlling equipment according to an embodiment of the present disclosure.

Drawings will be used below to disclose a plurality of embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Please refer to FIG. 1. FIG. 1 is a schematic view of a temperature controlling equipment 100 according to an embodiment of the present disclosure. As shown in FIG. 1, a temperature fluid of a specific temperature enters into the temperature controlling equipment 100 through the temperature fluid entrance 101. After passing through the working space 121A in the temperature controlling equipment 100, the temperature fluid leaves the temperature controlling equipment 100 through the temperature fluid exit 102. In this embodiment, the temperature fluid can be a fluid of a low temperature. For example, the temperature of the temperature fluid can be as low as −80° C. However, this does not intend to limit the present disclosure. The device under test (DUT) (not shown in FIG. 1) is located in the working space 121A.

Figure 2:
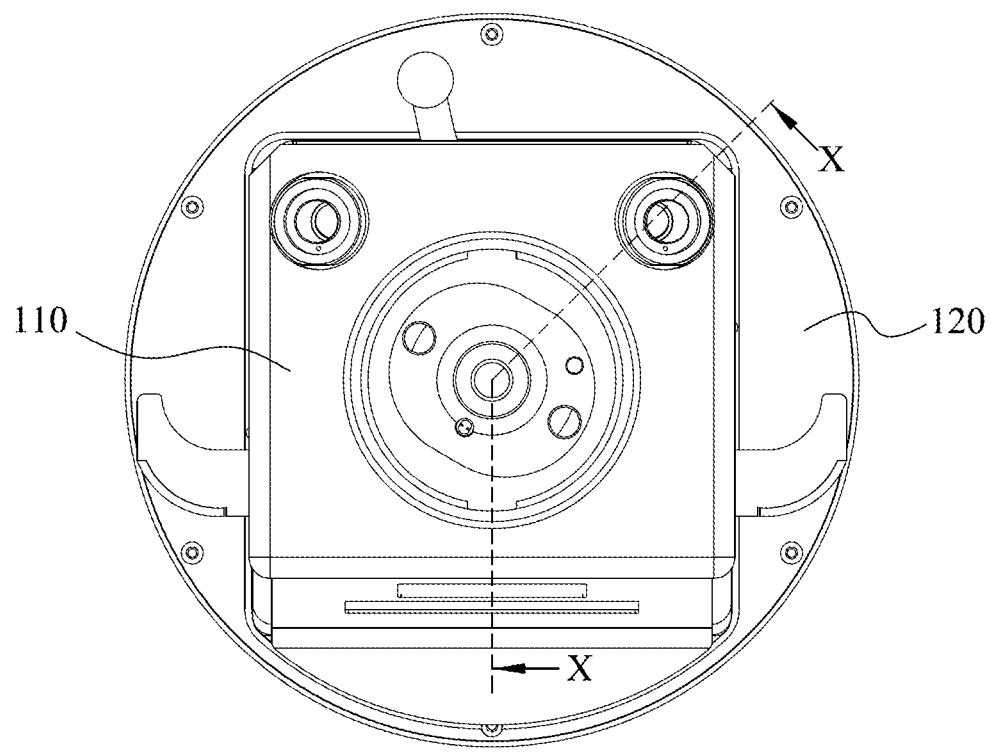
FIG. 2 is a plan view of the temperature controlling equipment of FIG. 1.
Figure 3:
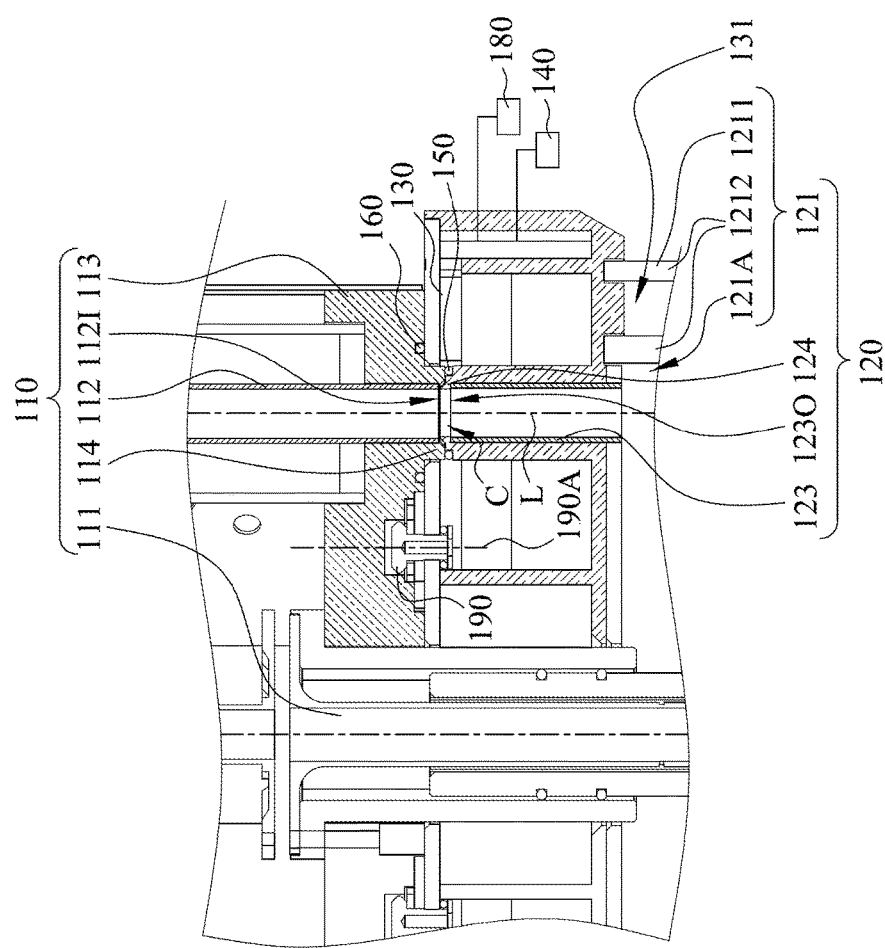
FIG. 3 is a partial sectional view of the temperature controlling equipment along the section line X of FIG. 2.

Please refer to FIGS. 2-3. FIG. 2 is a plan view of the temperature controlling equipment 100 of FIG. 1. FIG. 3 is a partial sectional view of the temperature controlling equipment 100 along the section line X of FIG. 2. To be more specific, as shown in FIGS. 1-3, the temperature controlling equipment 100 includes a connection head 110 of a fluid output device (not shown in FIGS. 1-3), an isolation hood 120, a drying chamber 130 and a dry air source 140. The connection head 110 of the fluid output device is connected with the isolation hood 120. The connection head 110 of the fluid output device has an output nozzle 111 and a first fluid output pipe 112. The isolation hood 120 has a hood body 121 and a second fluid output pipe 123. The hood body 121 defines the working space 121A. The output nozzle 111 is communicated with the working space 121A. The second fluid output pipe 123 is communicated with the working space 121A and the first fluid output pipe 112. The first fluid output pipe 112 and the second fluid output pipe 123 have a connection interface C in between. The connection interface C is at least partially located in the drying chamber 130. The dry air source 140 is communicated with the drying chamber 130 and is configured to provide a dry air to the drying chamber 130. In other words, in this embodiment, the drying chamber 130 is communicated with the dry air source 140, and is disposed on the working space 121A.

Structurally speaking, the connection head 110 of the fluid output device has a lower half adjacent to the isolation hood 120, and an upper half away from the isolation hood 120. An exit of the first fluid output pipe 112 is located at the upper half. The exit of the first fluid output pipe 112 is the temperature fluid exit 102 as mentioned above. When the temperature controlling equipment 100 operates, the output nozzle 111 delivers the temperature fluid to the working space 121A so as to provide a testing temperature to the DUT. Afterwards, the used temperature fluid leaves the working space 121A, and is discharged outside the connection head 110 of the fluid output device through the temperature fluid exit 102.

Furthermore, as shown in FIG. 3, the hood body 121 includes a cover 1211 and a transparent quartz pipe 1212. The cover 1211 and the transparent quartz pipe 1212 define together the working space 121A. The drying chamber 130 is located in the cover 1211. The transparent quartz pipe 1212 has an outer portion and an inner portion. The outer portion and the inner portion define an isolation space 131 in between. The isolation space 131 is communicated with the drying chamber 130. This means the dry air provided by the dry air source 140 can flow to the drying chamber 130 and the isolation space 131, so as to isolate the low temperature of the working space 121A, avoiding the phenomenon of frosting or dew condensation outside the hood body 121. The isolation hood 120 has a dry air exit (not shown). In this embodiment, the dry air exit can be the small holes (not shown) surrounding outside the transparent quartz pipe 1212, so as to maintain the transparent quartz pipe 1212 not to frost or condense as dew. In addition, as mentioned above, the connection interface C is at least partially located in the drying chamber 130. Therefore, even if a little leakage of the temperature fluid occurs at the connection interface C, the temperature fluid leaked will be first diluted by the dry air in the drying chamber 130, and then discharged outside the isolation hood 120. Thus, the phenomenon of frosting or dew condensation at the connection interface C is avoided. The transparent quartz pipe 1212 is transparent in nature, so as to allow the user to see the testing conditions of the DUT in the working space 121A.

In general, the dry air can be clean dry air (CDA). Since the dry air has no moisture (or has a very low moisture content), when the dry air contacts with the temperature fluid of a low temperature, no condensation of moisture occurs. Thus, the phenomenon of frosting or dew condensation is avoided.

In other words, after passing through the working space 121A, the temperature fluid will leave the temperature controlling equipment 100 through the second fluid output pipe 123 of the isolation hood 120 and the first fluid output pipe 112 of the connection head 110 of the fluid output device. When the temperature fluid passes through the connection interface C between the first fluid output pipe 112 and the second fluid output pipe 123, even if a little leakage of the temperature fluid occurs at the connection interface C, since the connection interface C is at least partially located in the drying chamber 130, the temperature fluid leaked will be first diluted by the dry air without moisture in the drying chamber 130, and then discharged outside the isolation hood 120. Thus, the phenomenon of frosting or dew condensation at the connection interface C is avoided.

As shown in FIG. 3, the temperature controlling equipment 100 further includes at least one sealing element 150. The sealing element 50 at least partially seals the connection interface C, so as to prevent the leakage of the temperature fluid at the connection interface C. In this embodiment, the quantity of the sealing element 150 is one, and the sealing element 150 is at least partially located in the drying chamber 130. In this way, even if a little leakage of the temperature fluid occurs at the connection interface C, since the sealing element 150 is at least partially located in the drying chamber 130, and the dry air in the drying chamber 130 has no moisture, the phenomenon of frosting or dew condensation at the sealing element 150 is avoided even though the temperature of the sealing element 150 drops because of the temperature fluid of a low temperature.

Furthermore, the temperature controlling equipment 100 further includes a heating device 180. The heating device 180 is thermally connected to the drying chamber 130, so as to increase the temperature of the dry air. In this way, the temperature of the sealing element 150 is also increased in response to the heated dry air. Even if the sealing element 150 contacts with the temperature fluid of a low temperature leaked at the connection interface C, the temperature of the sealing element 150 will not drop to the low temperature of the temperature fluid, and the sealing element 150 will not be hardened due to the temperature drop. As a result, the sealing effect of the sealing element 150 can be maintained.

In this embodiment, the drying chamber 130 is at least partially located in the hood body 121. However, this does not intend to limit the present disclosure. For example, in some embodiments, the drying chamber 130 can be partially located in the hood body 121, and partially located in the connection head 110 of the fluid output device.

To be more specific, as shown in FIG. 3, the connection head 110 of the fluid output device includes a main body 113 and a protruding portion 114. The protruding portion 114 is located at a side of the main body 113 facing the hood body 121, and the protruding portion 114 protrudes towards the hood body 121, in which an entrance 1121 of the first fluid output pipe 112 is located on an end surface of the protruding portion 114. The isolation hood 120 includes a recessed portion 124. The recessed portion 124 is located at a side of the hood body 121 facing the main body 113, and the protruding portion 114 at least partially extends to the recessed portion 124, in which an exit 123O of the second fluid output pipe 123 is located in the recessed portion 124 and is communicated with the entrance 1121 of the first fluid output pipe 112, and the recessed portion 124 is communicated with the dry air source 140, such that the recessed portion 124 becomes at least a part of the drying chamber 130. This means the second fluid output pipe 123 has the recessed portion 124 near the exit 123O, and the recessed portion 124 is at least partially located in the drying chamber 130.

In other words, since the protruding portion 114 of the connection head 110 of the fluid output device, the recessed portion 124 of the isolation hood 120, and the entrance 1121 of the first fluid output pipe 112 are located on the end surface of the protruding portion 114, and the exit 123O of the second fluid output pipe 123 is located in the recessed portion 124, the connection interface C between the first fluid output pipe 112 and the second fluid output pipe 123 can be at least partially located in the drying chamber 130.

Furthermore, as shown in FIG. 3, the sealing element 150 is located between the end surface of the protruding portion 114 and a bottom surface of the recessed portion 124, and the sealing element 150 surrounds the entrance 1121 of the first fluid output pipe 112 and the exit 123O of the second fluid output pipe 123, so as to prevent the leakage of the temperature fluid at the connection interface C between the first fluid output pipe 112 and the second fluid output pipe 123.

On the other hand, the temperature controlling equipment 100 further includes a sealing element 160. The sealing element 160 is located between the main body 113 and the isolation hood 120, and the sealing element 160 surrounds the recessed portion 124 and the protruding portion 114, so as to prevent the leakage of the dry air inside the drying chamber 130.

In order to simplify the structure of the temperature controlling equipment 100, a channel center of the first fluid output pipe 112 and a channel center of the second fluid output pipe 123 are substantially located on a same straight line L.

Moreover, in order to achieve a better sealing effect between the second fluid output pipe 123 and the first fluid output pipe 112 during the assembly of the connection head 110 of the fluid output device and the isolation hood 120, as shown in FIG. 3, a part of the second fluid output pipe 123 adjacent to the first fluid output pipe 112 diminishingly inclines towards the direction facing the first fluid output pipe 112. In this way, even if an angular deviation of the first fluid output pipe 112 occurs relative to the second fluid output pipe 123, since the second fluid output pipe 123 is designed to be inclined, the sealing effect between the second fluid output pipe 123 and the first fluid output pipe 112 can be maintained.

As shown in FIG. 3, the temperature controlling equipment 100 further includes an assembly and disassembly device 190. The assembly and disassembly device 190 is connected with the connection head 110 of the fluid output device and the isolation hood 120. The assembly and disassembly device 190 has a force exertion combination center 190A. In order to achieve a better sealing effect at the connection interface C, a distance between the force exertion combination center 190A and the channel center (i.e. the straight line L) of the second fluid output pipe 123 should be as close as possible. In this embodiment, the distance between the force exertion combination center 190A and the channel center (i.e. the straight line L) of the second fluid output pipe 123 is less than 4 cm. However, this does not intend to limit the present disclosure.

Figure 4:
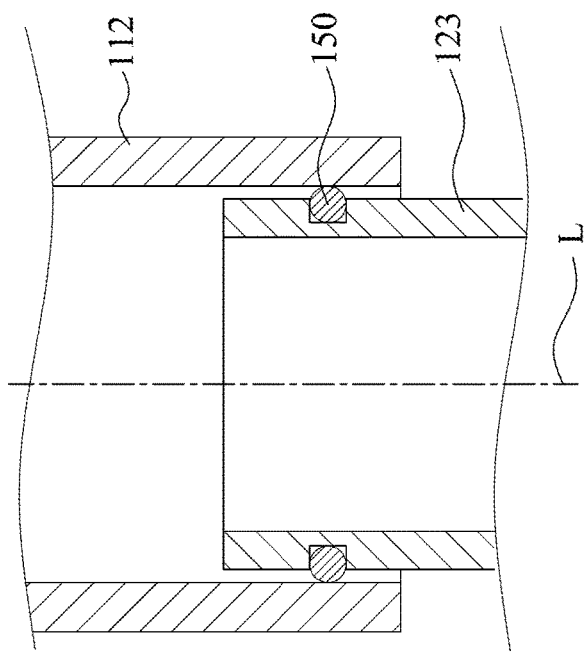
FIG. 4 is a partially magnified sectional view of a temperature controlling equipment according to another embodiment of the present disclosure.

Please refer to FIG. 4. FIG. 4 is a partially magnified sectional view of a temperature controlling equipment 100 according to another embodiment of the present disclosure. Apart from the description mentioned above that the sealing element 150 is located between the end surface of the protruding portion 114 and the bottom surface of the recessed portion 124, the sealing element 150 can also seal radially between the first fluid output pipe 112 and the second fluid output pipe 123. As shown in FIG. 4, an inner diameter of the first fluid output pipe 112 is larger than an outer diameter of the second fluid output pipe 123 (in another embodiment, an inner diameter of the second fluid output pipe 123 is larger than or equal to an outer diameter of the first fluid output pipe 112), such that the second fluid output pipe 123 is at least partially located in the first fluid output pipe 112, and the sealing element 150 can seal radially between an inner wall of the first fluid output pipe 112 and an outer wall of the second fluid output pipe 123, so as to prevent the leakage of the temperature fluid.

In summary, when compared with the prior art, the embodiments of the present disclosure mentioned above have at least the following advantages:

(1) Since the connection interface is at least partially located in the drying chamber, even if a little leakage of the temperature fluid occurs at the connection interface, the temperature fluid leaked will be first diluted by the dry air without moisture in the drying chamber, and then discharged outside the isolation hood. Thus, the phenomenon of frosting or dew condensation at the connection interface is avoided.

(2) Since the sealing element is at least partially located in the drying chamber, and the dry air in the drying chamber has no moisture, the phenomenon of frosting or dew condensation at the sealing element is avoided even though the temperature of the sealing element drops because of the temperature fluid of a low temperature.

(3) Since the temperature of the sealing element is increased in response to the heated dry air, even if the sealing element contacts with the temperature fluid of a low temperature leaked at the connection interface, the temperature of the sealing element will not drop to the low temperature of the temperature fluid, and the sealing element will not be hardened due to the temperature drop. As a result, the sealing effect of the sealing element can be maintained.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. An isolation hood configured to connect with a connection head in a temperature controlling equipment, the connection head having an output nozzle and a first fluid output pipe, the isolation hood comprising:
    a hood body and a second fluid output pipe, the hood body defining a working space configured to be communicated with the output nozzle, the second fluid output pipe being configured to communicate with the working space and the first fluid output pipe, an entrance of the first fluid output pipe and an exit of the second fluid output pipe having a connection interface in between, a channel center of the entrance of the first fluid output pipe and a channel center of the exit of the second fluid output pipe being located on a same straight line, the isolation hood having a recessed portion located at a side of the hood body facing the first fluid output pipe, the exit of the second fluid output pipe being located in the recessed portion; and
    a drying chamber connected with a dry air source, the drying chamber being disposed on the working space, and the recessed portion being at least partially located in the drying chamber.

2. The isolation hood of claim 1, further comprising:
    at least one sealing ring at least partially sealing the connection interface between, and the sealing ring being at least partially located in the drying chamber.

3. A temperature controlling equipment, comprising:
    a connection head having an output nozzle and a first fluid output pipe;
    an isolation hood having a hood body and a second fluid output pipe, the hood body defining a working space, the output nozzle being communicated with the working space, the second fluid output pipe being communicated with the working space and the first fluid output pipe, an entrance of the first fluid output pipe and an exit of the second fluid output pipe having a connection interface in between, a channel center of the entrance of the first fluid output pipe and a channel center of the exit of the second fluid output pipe being located on a same straight line;
    a drying chamber, the connection interface being at least partially located in the drying chamber; and
    a dry air source communicated with the drying chamber, the dry air source being configured to provide a dry air to the drying chamber.

4. The temperature controlling equipment of claim 3, further comprising:
    at least one sealing ring at least partially sealing the connection interface, and the sealing ring being at least partially located in the drying chamber.

5. The temperature controlling equipment of claim 3, wherein the drying chamber is at least partially located in the hood body.

6. The temperature controlling equipment of claim 3, wherein the connection head comprises:
    a main body; and
    a protruding portion located at a side of the main body facing the hood body, and the protruding portion protrudes towards the hood body, wherein the entrance of the first fluid output pipe is located on an end surface of the protruding portion;
    wherein the isolation hood comprises:
    a recessed portion located at a side of the hood body facing the main body, and the protruding portion at least partially extends to the recessed portion, wherein the exit of the second fluid output pipe is located in the recessed portion and is communicated with the entrance of the first fluid output pipe, and the recessed portion is communicated with the dry air source, such that the recessed portion becomes at least a part of the drying chamber.

7. The temperature controlling equipment of claim 6, further comprising:
    at least one sealing ring located between the end surface of the protruding portion and a bottom surface of the recessed portion, and the sealing ring surrounding the entrance of the first fluid output pipe and the exit of the second fluid output pipe.

8. The temperature controlling equipment of claim 6, further comprising:
    a sealing ring located between the main body and the isolation hood, and the sealing ring surrounding the recessed portion and the protruding portion.

9. The temperature controlling equipment of claim 3, wherein the connection head has a lower half adjacent to the isolation hood and an upper half away from the isolation hood, an exit of the first fluid output pipe is located at the upper half.

10. The temperature controlling equipment of claim 3, further comprising:
    a heating device thermally connected to the drying chamber.

11. The temperature controlling equipment of claim 3, wherein a channel center of the first fluid output pipe and a channel center of the second fluid output pipe are substantially located on the same straight line.

12. The temperature controlling equipment of claim 3, further comprising:
    an assembly and disassembly device connected with the connection head and the isolation hood, the assembly and disassembly device having a force exertion combination center, a distance between the force exertion combination center and a channel center of the second fluid output pipe is less than 4 cm.

13. The temperature controlling equipment of claim 3, wherein a part of the second fluid output pipe adjacent to the first fluid output pipe diminishingly inclines towards a direction facing the first fluid output pipe.

* * * * *